United States Patent
Liao et al.

(10) Patent No.: US 10,326,054 B1
(45) Date of Patent: *Jun. 18, 2019

(54) ULTRAVIOLET LIGHT EMITTING DEVICE DOPED WITH BORON

(71) Applicant: RayVio Corporation, Hayward, CA (US)

(72) Inventors: Yitao Liao, Redwood City, CA (US); Douglas A. Collins, Hayward, CA (US); Wei Zhang, Hayward, CA (US)

(73) Assignee: RayVio Corporation, Hayward, CA (US)

( * ) Notice: Subject to any disclaimer, the term of this patent is extended or adjusted under 35 U.S.C. 154(b) by 5 days.

This patent is subject to a terminal disclaimer.

(21) Appl. No.: 15/877,005

(22) Filed: Jan. 22, 2018

Related U.S. Application Data

(63) Continuation of application No. 14/504,202, filed on Oct. 1, 2014, now Pat. No. 9,876,143.

(51) Int. Cl.
*H01L 33/32* (2010.01)
*H01L 33/06* (2010.01)
(Continued)

(52) U.S. Cl.
CPC ........ *H01L 33/325* (2013.01); *H01L 21/0254* (2013.01); *H01L 21/02551* (2013.01);
(Continued)

(58) Field of Classification Search
None
See application file for complete search history.

(56) References Cited

U.S. PATENT DOCUMENTS 7,193,246 B1  3/2007  Tanizawa et al.
7,498,182 B1 *  3/2009  Sampath ............... B82Y 20/00
                                          438/21

(Continued)

FOREIGN PATENT DOCUMENTS

JP  2001085739  *  9/1999  ............ H01L 33/00
JP  2007-294877 A  11/2007
(Continued)

OTHER PUBLICATIONS

V.N. Jmerik et al., "AlGanN-based Quantum-Well Heterostructures for Deep Ultraviolet Light-Emitting Diodes Grown by Submonolayer Discrete Plasma-assisted Molecular-Beam Epitaxy", Semiconductors, 2008, pp. 1420-1426, vol. 42, No. 12, Pleiades Publishing, Ltd., Minsk, Belarus.

(Continued)

*Primary Examiner* — Herve-Louis Y Assouman
(74) *Attorney, Agent, or Firm* — Patent Law Group LLP; Brian D. Ogonowsky

(57) ABSTRACT

In an example, the present invention provides a light-emitting device configured to emit electromagnetic radiation in a range of 210 to 360 nanometers. The device has a substrate member comprising a surface region. The device has a thickness of AlGaN material formed overlying the surface region and an aluminum concentration characterizing the AlGaN material having a range of 0 to 100%. The device has a boron doping concentration characterizing the AlGaN material having a range between 1e15 to 1e20 atoms/centimeter3.

16 Claims, 7 Drawing Sheets

(51) Int. Cl.
*H01L 33/00* (2010.01)
*H01L 21/02* (2006.01)
*H01L 33/12* (2010.01)

(52) U.S. Cl.
CPC .......... *H01L 33/0075* (2013.01); *H01L 33/06* (2013.01); *H01L 33/12* (2013.01)

(56) References Cited

U.S. PATENT DOCUMENTS

| | | | |
|---|---|---|---|
| 8,680,551 B1 | 3/2014 | Adivarahan et al. | |
| 8,723,189 B1 | 5/2014 | Liao et al. | |
| 9,876,143 B2* | 1/2018 | Liao | H01L 33/06 |
| 2003/0006430 A1 | 1/2003 | Shibata et al. | |
| 2003/0178633 A1 | 9/2003 | Flynn et al. | |
| 2005/0230701 A1 | 10/2005 | Huang | |
| 2006/0011946 A1 | 1/2006 | Toda et al. | |
| 2007/0075307 A1 | 4/2007 | Yoon et al. | |
| 2008/0157102 A1 | 7/2008 | Hori et al. | |
| 2009/0194784 A1* | 8/2009 | Kaji | H01L 33/16 257/103 |
| 2009/0206320 A1 | 8/2009 | Chua et al. | |
| 2009/0302308 A1 | 12/2009 | Chua et al. | |
| 2010/0176375 A1* | 7/2010 | Lochtefeld | H01L 21/02381 257/14 |
| 2010/0219395 A1 | 9/2010 | Hirayama et al. | |
| 2010/0270532 A1 | 10/2010 | Takano et al. | |
| 2011/0049549 A1* | 3/2011 | Kim | H01L 33/007 257/98 |
| 2013/0026482 A1 | 1/2013 | Fenwick | |
| 2013/0285065 A1* | 10/2013 | Zhu | H01L 21/02458 257/76 |

FOREIGN PATENT DOCUMENTS

| | | |
|---|---|---|
| JP | 2011-82494 A | 4/2011 |
| JP | 2012-227228 A | 11/2012 |

OTHER PUBLICATIONS

International Search Report and Written Opinion for PCT/US2015/053199, filed Sep. 30, 2015.

* cited by examiner

US 10,326,054 B1

ULTRAVIOLET LIGHT EMITTING DEVICE DOPED WITH BORON

BACKGROUND OF INVENTION

The bandgap of III-nitride materials, including (Al, Ga, In)—N and their alloys, extends from the very narrow gap of InN (0.7 eV) to the very wide gap of AlN (6.2 eV), making them highly suitable for optoelectronic applications such as light emitting diodes (LEDs), laser diodes, optical modulators, and detectors over a wide spectral range extending from the near infrared to the deep ultraviolet. Visible light LEDs can be obtained using InGaN in the active layers, while ultraviolet (UV) LEDs require the larger bandgap of AlGaN.

Visible spectrum LEDs based on InGaN and AlInGaP systems have reached maturity and are now in mass production. However, the development of UV LEDs is still hampered by a number of difficulties involving basic material properties of AlGaN alloys, especially those with high Al content. Compared to LEDs in the visible spectral range with external quantum efficiency (EQE, the ratio of extracted photons to injected electron-hole pairs) of more than 50%, deep UV LEDs, such as those emitting below 300 nm, have an EQE of only up to 1%.

UV LEDs with emission wavelengths in the range of 230-350 nm are expected to find a wide range of applications, most of which are based on the interaction between UV radiation and biological material. Typical applications include surface sterilization, water purification, medical devices and biochemistry, light sources for ultra-high density optical recording, white lighting, fluorescence analysis, sensing, and zero-emission automobiles. Although under extensive research for many years, UV LEDs, especially those emitting below 300 nm, remain extremely inefficient when compared to their blue and green counterparts.

The growth of III-nitrides onto the c-plane sapphire is well-established. However, III-nitride material grown on c-plane sapphire suffers from the presence of polarization fields due to the polar nature of crystal bonds, which lead to energy band bending and reduction of recombination efficiency in quantum heterostructures due to physical separation of electron-hole wave functions, commonly known as the Quantum Confined Stark Effect (QCSE). Due to lattice mismatch, III-nitride materials grown on sapphire suffer from a high density of defects such as dislocations and inversion domains. A number of methods have been developed to obtain high quality single crystal material for device applications, including optimization of the nucleation process and choice of buffer layers to accommodate lattice mismatch. Alternative substrates, such as (001) Si, lithium aluminum oxide ($LiAlO_3$) and silicon carbide (SiC) of various crystallographic planes also have been used for certain applications. However, native GaN and AlN substrates are still under development and remain prohibitively expensive.

These and other limitations are described throughout the present specification and more particularly below.

SUMMARY OF INVENTION

In an example, the present invention provides a light-emitting device configured to emit electromagnetic radiation in a range of 210 to 360 nanometers. The device has a substrate member comprising a surface region. The device has a thickness of AlGaN material formed epitaxially in a single crystal growth overlying the surface region and an aluminum concentration characterizing the AlGaN material having a range of 0 to 100%. The device has a boron doping concentration characterizing the AlGaN material having a range between 1e15 to 1e20 atoms/centimeter3.

Various benefits are achieved over pre-existing techniques using the present invention. In particular, the present invention enables a cost-effective UV LED using conventional process. Depending upon the embodiment, the present apparatus and method can be manufactured using conventional materials and/or methods according to one of ordinary skill in the art. Of course, there can be other variations, modifications, and alternatives. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

DETAILED DESCRIPTION OF THE SPECIFIC EXAMPLES

Figure 1:
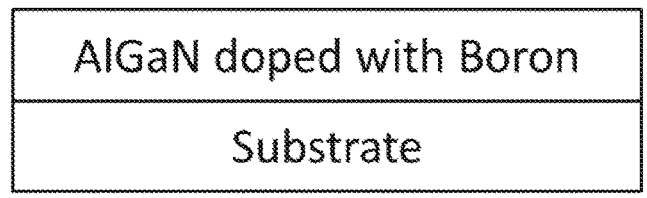
FIG. 1 is a simplified cross-sectional view of a thickness of AlGaN doped with boron overlying a substrate surface region.

As background, structural point defects are unavoidable in semiconducting crystals. For the AlGaN system in particular Ga vacancies (VGa) and Ga interstitials (IGa) are common. Furthermore the density of these point defects can vary both laterally and with depth in an epitaxial layer. When current flows in a device made with these materials, the point defects can migrate through the device and cause early device failure.

This disclosure describes a way to influence the migration of these defects by introduction of localized strain induced by a dopant. We propose doping the AlGaN epi layers with a small amount of boron (B). Such localized strain is expected to produce alteration of defect migration. For example, introduction of boron as an impurity dopant is expected to induce dislocation inclination which helps to reduce dislocation density in the AlGaN film. For example, Ref 1 describes a way to incline dislocation in AlGaN by introduction of Si as a dopant. [1]

The level of boron introduced to the AlGaN lattice is very small (typically in the range between 1e16 atoms/cc to 1e20 atoms/cc), constituting less than one percent of the mole fraction relative to the alloy composition of $B_xAl_yGa_{1-x-y}N$ (where x is less than one percent). For example, at Ga or Al atomic density of ~2e22 atoms/cc, the range of boron doped into the AlGaN lattice is between one boron every one million Ga or Al atoms, to one boron every one hundred Ga or Al atoms.

It is important to note that, given the small level of boron being introduced to the AlGaN, boron as a dopant is not intended to alter the differences between the AlGaN and the substrate materials in their average lattice constants or thermal expansion coefficients. In an example, an average lattice constant of AlGaN is maintained for the thickness of AlGaN material, while having boron provided with a localized spatial region.

It is also important to note that the boron is a dopant into the AlGaN crystal lattice, but does not form a quaternary material such as BAlGaN, BAlN, or BGaN, or pure BN.

The atomic radius of B is smaller than both aluminum (Al) and gallium (Ga) but larger than that of nitrogen (N.) Where the B incorporates into the film there will be a local strain field, which is compressive (tensile) if B substitutes for N (Al or Ga.) Depending on the sign of the local strain field this will tend to either expel or trap the point defects in the immediate neighborhood of the B atom. Or incline/bend the dislocation in the AlGaN material leading to reduced dislocation density. With proper device design this leads to enhanced device reliability.

Defects are a common cause of failures in semiconductor devices. Defects can be categorized in two broad categories, which need different strategies to manage: impurities and structural defects. Impurity concentrations can in principle be reduced below any arbitrary level given enough care in source preparation and material synthesis.

Structural defects are things like vacancies (e.g., missing atoms) interstitials (i.e., atoms that sit between lattice sites) and antisites (e.g. in the case of AlN, this could be an Al atom sitting on a N lattice site). These types of defects often can never be eliminated. The equilibrium concentration of these types of defects is given by $C=Nsites\, Exp(-Q/kT)$ where Nsites is the number available sites for a particular defect to form, Q is the formation energy of the defect, k is the Boltzman constant and T is the temperature in Kelvin. The values of Q are not well known for the AlGaN system, but for GaN the most likely defects are Ga vacancies (VGa) which can have Q's as low as 1.1 eV [2] and Ga interstitials (IGa) with values of Q as low as 1.26 eV [3]. The temperature in the defect concentration equation is the temperature at which the material is formed. So for a growth temperature of 900 C the equilibrium defect concentrations are VGa ~2e18/cc and IGa ~5e17/cc. This can be comparable to or greater than the free carrier concentration and can greatly affect device behavior. Additionally it has been recently observed that for GaN grown on sapphire, VGa can vary from 1e16/cc to 1e19/cc within an epitaxial layer [4] with the highest concentration of defects being near the GaN/sapphire interface.

These intrinsic defects are one cause of device failure. First, the equilibrium defect concentration is determined by the temperature at which the material is formed. This is generally 600 to 800 C higher than the temperature at which the device operates. Consequently the defect concentration during device operation is very far from equilibrium and the excess defects will tend to migrate through the device. The forces driving this migration include defect density gradients, voltages, current gradients, electrostatic fields from fixed electric charges and temperature gradients within the device caused but non-uniform current flow. These defects can be non-radiative recombination centers, which extract energy from the current flow and dump it into the crystal in the form of heat. This local heating is a cause of device failure.

As noted above the atomic radius of B is smaller than that of Al and Ga, but larger than N. As a result, when B incorporates into the lattice it will cause either local tensile or compressive strain depending on whether it sits on a group III or group V site. Because of this it is possible to tune the local strain between compression and tension by appropriate choice of growth conditions, as a way of defect management in AlGaN. The simplest way to influence the location of the B atoms of is to use either N-rich or N-poor growth conditions. For N-rich growth B will tend to incorporate on the group III site while for N-poor growth it will tend to sit on the group V sites. The relative concentration of B in the two sub-lattices is controlled by how N-rich or N-poor the growth is in reference to a standard stoichiometry. Finally, if the growth is stoichiometric, nearly equal incident fluxes of group III and group V atoms, then the B will tend to incorporate into both of the sublattices. In this case, there will be very low net strain, but there will be both tensile and compressive local strains.

When the local strain is compressive, vacancies will tend to migrate into the film to relieve that strain. While if the local strain is tensile, vacancies in the vicinity will tend to be expelled. By proper choice of the growth conditions it is possible to influence the migration path of the vacancies so they are expelled from certain portions of the AlGaN film, and trapped in other portions of the device. With proper device design and growth conditions, the point defects will migrate out of the portions of the device that carry high currents, and be trapped in regions where little or no current flows. This will lead to greatly improve device reliability. Further details of the present techniques can be found throughout the present specification and more particularly below.

FIG. 1 is a simplified cross-sectional view of a thickness of AlGaN doped with boron overlying a substrate surface region. In an example, the device is a light emitting device configured to emit electromagnetic radiation in a range of 210 to 360 nanometers. As shown, the device has a substrate member comprising a surface region. The substrate member can be sapphire, gallium nitride, aluminum nitride, silicon carbide, silicon, or other materials, including combinations thereof, and the like. The substrate member has a surface region, which can be treated or not treated.

In an example, the surface region is treated using nitrogen containing species such as ammonia, but can also be hydrogen. The surface can also be treated by plasma. In an example, the treatment is exposed to ammonia gas in a chamber or a hydrogen plasma chamber. In other embodiments, an inert gas can be used to treat the surface region. The surface region can also have a characteristic of being smooth and/or patterned, among other combinations. In an example, the surface region is preferably smooth.

Figure 2:
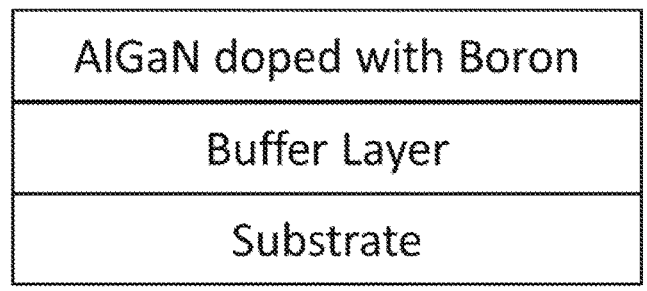
FIG. 2 is a simplified cross section of an AlGaN doped with boron on buffer layers overlying a substrate surface region.

FIG. 2 is a simplified cross section of an AlGaN doped with boron on buffer layers overlying a substrate surface region. In an example, the device is a light emitting device configured to emit electromagnetic radiation in a range of 210 to 360 nanometers. As shown, the device has a substrate member comprising a surface region. The substrate member can be sapphire, gallium nitride, aluminum nitride, silicon carbide, silicon, or other materials, including combinations thereof, and the like. The substrate member has a surface region, which can be treated or not treated.

In an example, the surface region is treated using nitrogen containing species such as ammonia, but can also be hydrogen. In an example, the treatment is exposed to ammonia gas in a chamber or a hydrogen plasma chamber. In other embodiments, an inert gas can be used to treat the surface region. The surface region can also have a characteristic of being smooth and/or patterned, among other combinations. In an example, the surface region is preferably smooth.

In an example, the substrate has an overlying buffer material, which can be a single layer or layers. In an example, the buffer material is a gallium and nitrogen containing material or an aluminum and gallium and nitrogen containing material with a boron species dopant and/or entity. In an example, the buffer material is formed by subjecting the surface of the substrate with a supply of multiple species, such as a nitrogen containing gas (e.g., pure nitrogen, ammonia), a gallium containing species (e.g., tri-methyl gallium or elemental gallium), and an aluminum containing species (e.g., tri-methyl aluminum or elemental aluminum or a sublimation of polycrystalline aluminum nitride), among others. In an example, boron is introduced using a boron containing gas species, or boron containing compound, or a process involving boron containing compound, among others. Boron is mixed with the aforementioned species. Of course, there can be other variations, modifications, and alternatives.

As shown, an n-type AlGaN material incorporated with a boron species dopant and/or entity is formed overlying the buffer material. In an example, the n-type AlGaN is formed using an Al containing, Ga containing and Si containing precursor species, at a growth temperature ranging from 500 C to 1500 C, measured by a thermocouple, a pyrometer, or among other temperature measurement methods. In another example, silicon is introduced using an implantation process to form the n-type AlGaN material. Of course, there can be other variations, modifications, and alternatives. As previously noted to manage defects in the film via creation of localized strain, boron can be added in this material, as well. Techniques for adding boron can include using a boron containing gas species, or boron containing compound, or a process involving boron containing compound, or among others. Boron is mixed with the aforementioned species. In an example, boron can be introduced using sputtering, a plasma, evaporation, implantation, and among others.

In an example, the thickness of AlGaN material formed as noted in the quantum well regions. In an example, an aluminum concentration characterizing the AlGaN material has a range of 0 to 100% and a boron doping concentration characterizing the AlGaN material has a range between 1e15 to 1e20 atoms/centimeter3.

Figure 5:
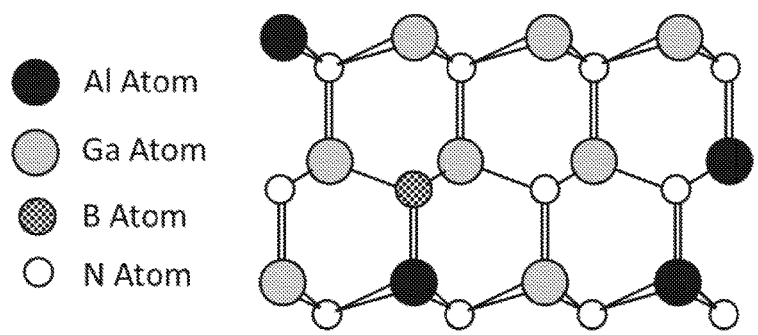
FIG. 5 is a simplified crystal lattice structure showing boron causing a localized compressive strain by substituting a nitrogen specie, which is smaller than boron, while maintaining the average lattice constant of the AlGaN crystal.
Figure 6:
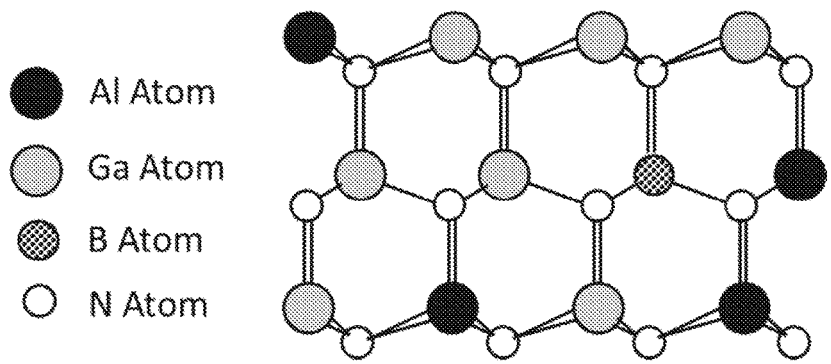
FIG. 6 is a simplified diagram of a crystal lattice structure showing boron causing a localized tensile strain by substituting a gallium (Ga) and/or aluminum (Al) species, which is larger than boron, while boron does not change the average lattice constant of the AlGaN crystal.

In an example, the boron doping concentration is configured to localize and fix a defect density within a spatial region of the thickness of AlGaN material. In an example, the AlGaN material can include any of the active regions or others. In an example, the boron doping concentration is configured to cause a local strain, the strain being in a compressive mode. In an example, the boron is configured to substitute an N species within the thickness of material to cause a strain, which is in a compressive mode, as illustrated by FIG. 5. In an example, the boron is configured to substitute either an aluminum or gallium species to cause a strain, which is in a tensile mode, again as illustrated by FIG. 6. In other examples, the boron is configured to cause both a local tensile mode and a compressive mode, again in FIG. 7. In other examples, the boron is selectively introduced to cause either or both a tensile mode or a compressive mode.

Figure 3:
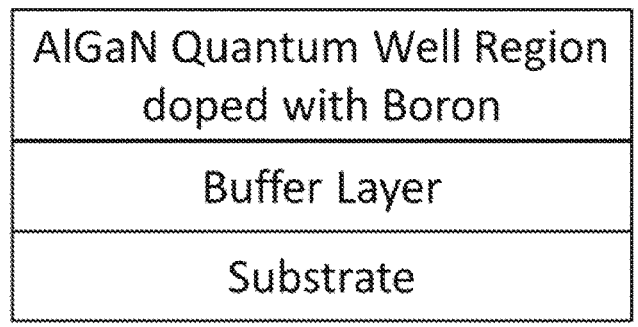
FIG. 3 is a simplified cross-sectional view diagram of an AlGaN Quantum Well Region emitting in the range between 210 nm and 360 nm, doped with boron on buffer layers overlying a substrate surface region.

FIG. 3 is a simplified cross-sectional view diagram of an AlGaN quantum well region emitting in the range between 210 nm and 360 nm, doped with boron on buffer layers overlying a substrate surface region. In an example, the device is a light-emitting device configured to emit electromagnetic radiation in a range of 210 to 360 nanometers. As shown, the device has a substrate member comprising a surface region. The substrate member can be sapphire, gallium nitride, aluminum nitride, silicon carbide, silicon, or other materials, including combinations thereof, and the like. The substrate member has a surface region, which can be treated or not treated.

In an example, the surface region is treated using nitrogen containing species such as ammonia, but can also be hydrogen. In an example, the treatment is exposed to ammonia gas in a chamber or a hydrogen plasma chamber. In other embodiments, an inert gas can be used to treat the surface region. The surface region can also have a characteristic of being smooth and/or patterned, among other combinations. In an example, the surface region is preferably smooth.

In an example, the substrate has an overlying buffer material, which can be a single layer or layers. In an example, the buffer material is a gallium and nitrogen containing material or an aluminum and gallium and nitrogen containing material with a boron species dopant and/or entity. In an example, the buffer material is formed by subject the surface of the substrate with a supply of multiple species, such as a nitrogen containing gas (e.g., pure nitrogen, ammonia), a gallium containing species (e.g., tri-methyl gallium or elemental gallium), and an aluminum containing species (e.g., tri-methyl aluminum or elemental aluminum or a sublimation of polycrystalline aluminum nitride), among others. In an example, boron is introduced using a boron containing gas species, or boron containing compound, among others. Boron is mixed with the aforementioned species. Of course, there can be other variations, modifications, and alternatives.

As shown, an n-type AlGaN material incorporated with a boron species dopant and/or entity is formed overlying the buffer material. In an example, the n-type AlGaN is formed using an Al containing, Ga containing and Si containing precursor species, at a temperature ranging from 500 C to 1500 C. In an example, silicon is introduced using an implantation process to form the n-type AlGaN material. Of course, there can be other variations, modifications, and alternatives. As previously noted to manage stress in the film, boron can be added in this material, as well. Techniques for adding boron can include using a boron containing gas species, or boron containing compound, among others. Boron is mixed with the aforementioned species. In an example, boron can be introduced using sputtering, a plasma, evaporation, implantation, and among others.

In an example, the method forms a plurality of quantum well regions are formed overlying the n-type material in an example. The plurality of quantum well regions can range from single to multiple well regions, among others. In an example, five well regions are formed.

In an example, the thickness of AlGaN material formed as noted in the quantum well regions. In an example, an aluminum concentration characterizing the AlGaN material has a range of 0 to 100% and a boron doping concentration characterizing the AlGaN material has a range between 1e15 to 1e20 atoms/centimeter3.

In an example, the boron doping concentration is configured to localize and fix a defect density within a spatial region of the thickness of AlGaN material. In an example, the AlGaN material can include any of the active regions or others. In an example, the boron doping concentration is configured to cause a local strain, the strain being in a compressive mode. In an example, the boron is configured to substitute an N species within the thickness of material to cause a strain, which is in a compressive mode, as illustrated by FIG. 5. In an example, the boron is configured to substitute either an aluminum or gallium species to cause a strain, which is in a tensile mode, again as illustrated by FIG. 6. In other examples, the boron is configured to cause both a local tensile mode and a compressive mode, again in FIG. 7. In other examples, the boron is selectively introduced to cause either or both a tensile mode or a compressive mode.

Figure 4:
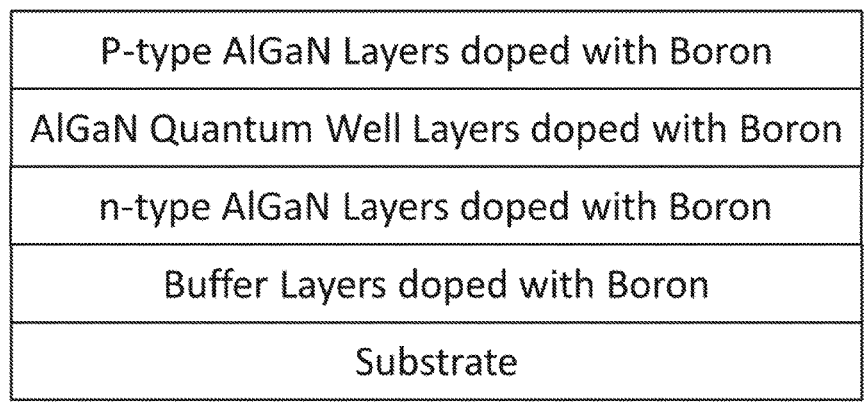
FIG. 4 is a simplified diagram of an AlGaN PN junction device with quantum well regions emitting in the range between 210 nm and 360 nm, doped with boron on buffer layers overlying a substrate surface region.

FIG. 4 is a simplified diagram of an AlGaN PN junction device with quantum well regions emitting in the range between 210 nm and 360 nm, doped with boron on buffer layers overlying a substrate surface region. In an example, the device is a light-emitting device configured to emit electromagnetic radiation in a range of 210 to 360 nanometers. As shown, the device has a substrate member comprising a surface region. The substrate member can be sapphire, gallium nitride, aluminum nitride, silicon carbide, silicon, or other materials, including combinations thereof, and the like. The substrate member has a surface region, which can be treated or not treated.

In an example, the surface region is treated using nitrogen containing species such as ammonia, but can also be hydrogen. In an example, the treatment is exposed to ammonia gas in a chamber or a hydrogen plasma chamber. In other embodiments, an inert gas can be used to treat the surface region. The surface region can also have a characteristic of being smooth and/or patterned, among other combinations. In an example, the surface region is preferably smooth.

In an example, the substrate has an overlying buffer material, which can be a single layer or layers. In an example, the buffer material is a gallium and nitrogen containing material or an aluminum and gallium and nitrogen containing material with a boron species dopant and/or entity. In an example, the buffer material is formed by subject the surface of the substrate with a supply of multiple species, such as a nitrogen containing gas (e.g., pure nitrogen, ammonia), a gallium containing species (e.g., tri-methyl gallium or elemental gallium), and an aluminum containing species (e.g., tri-methyl aluminum or elemental aluminum or a sublimation of polycrystalline aluminum nitride), among others. In an example, boron is introduced using a boron containing gas species, or boron containing compound, among others. Boron is mixed with the aforementioned species. Of course, there can be other variations, modifications, and alternatives.

As shown, an n-type AlGaN material incorporated with a boron species dopant and/or entity is formed overlying the buffer material. In an example, the n-type AlGaN is formed using an Al containing, Ga containing and Si containing precursor species, at a temperature ranging from 500 C to 1500 C. In an example, silicon is introduced using an implantation process to form the n-type AlGaN material. Of course, there can be other variations, modifications, and alternatives. As previously noted to manage stress in the film, boron can be added in this material, as well. Techniques for adding boron can include using a boron containing gas species, or boron-containing compound, among others. Boron is mixed with the aforementioned species. In an example, boron can be introduced using sputtering, a plasma, evaporation, implantation, and among others.

In an example, the method forms a plurality of quantum well regions are formed overlying the n-type material in an example. The plurality of quantum well regions can range from single to multiple well regions, among others. In an example, five well regions are formed.

In an example, a p-type AlGaN material is formed overlying the quantum well regions. The p-type material is formed from an Al containing, Ga containing and Mg containing species. In an example, a p-type GaN material is formed overlying the p-type AlGaN material overlying the quantum well regions.

In an example, the thickness of AlGaN material formed as noted in the quantum well regions. In an example, an aluminum concentration characterizing the AlGaN material has a range of 0 to 100% and a boron doping concentration characterizing the AlGaN material has a range between 1e15 to 1e20 atoms/centimeter3.

In an example, the boron doping concentration is configured to localize and fix a defect density within a spatial region of the thickness of AlGaN material. In an example, the AlGaN material can include any of the active regions or others. In an example, the boron doping concentration is configured to cause a local strain, the strain being in a compressive mode. In an example, the boron is configured to substitute an N species within the thickness of material to cause a strain, which is in a compressive mode, as illustrated by FIG. 5. In an example, the boron is configured to substitute either an aluminum or gallium species to cause a strain, which is in a tensile mode, again as illustrated by FIG. 6. In other examples, the boron is configured to cause both a local tensile mode and a compressive mode, again in FIG. 7. In other examples, the boron is selectively introduced to cause either or both a tensile mode or a compressive mode.

FIG. 5 is a simplified crystal lattice structure showing boron causing a localized compressive strain by substituting an N species, which is smaller than B. As shown, the larger boron atom replaces the smaller nitrogen atom to cause localized compressive strain in an example.

FIG. 6 is a simplified diagram of a crystal lattice structure showing boron causing a localized tensile strain by substituting a Ga and/or Al species, which is larger than B. As shown, the smaller boron atom causes localized tensile strain by replacing the larger gallium or aluminum atom in an example.

Figure 7:
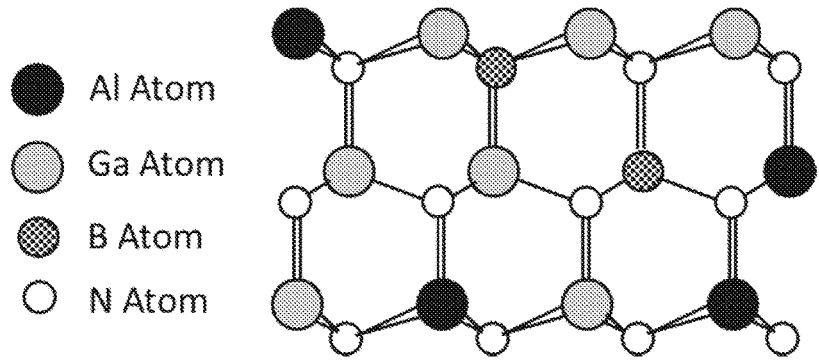
FIG. 7 illustrates a crystal lattice structure showing boron causing both a localized tensile strain and a localized compressive strain by substituting a gallium and/or aluminum species and nitrogen species, while the boron does not change the average lattice constant of the AlGaN crystal.

FIG. 7 illustrates a crystal lattice structure showing boron causing both a localized tensile strain and a localized compressive strain by substituting a Ga and/or Al species and N species. In other examples, the aluminum concentration ranges from 1 to 80%; wherein the boron doping concentration ranges from 1e16 to 1e18 atoms/centimeter3. In other examples, the boron is configured as a dopant within the AlGaN.

In an example, the emitted light from the boron doped AlGaN is pumped by an external source providing carriers into the thickness of AlGaN layer in the form of another light source or electron source. An example is shown in FIG. 8.

Figure 8:
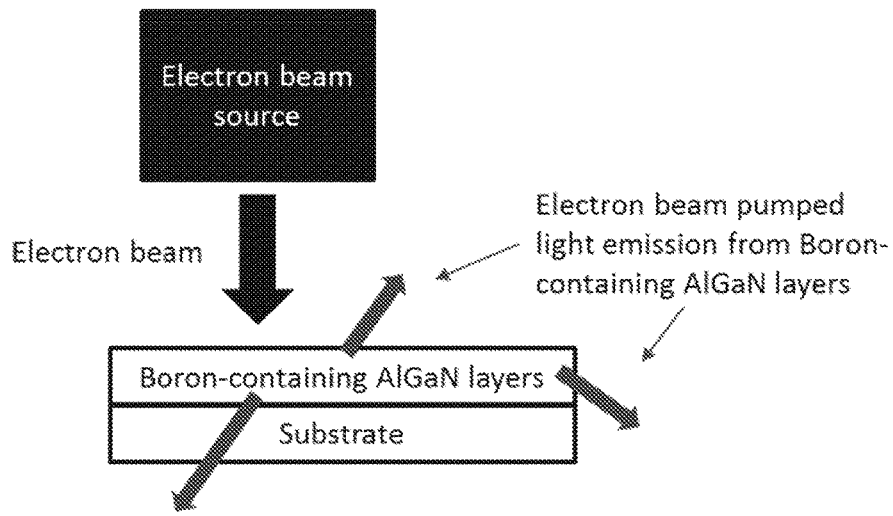
FIG. 8 is an illustration of light emission from boron doped AlGaN layers pumped by an external electron beam source.

FIG. 8 is an illustration of light emission from boron doped AlGaN layers pumped by an external electron beam source. In an example, the present method provides a sequence of steps for fabricating a light-emitting device configured to emit electromagnetic radiation in a range of 210 to 360 nanometers.

Figure 9:
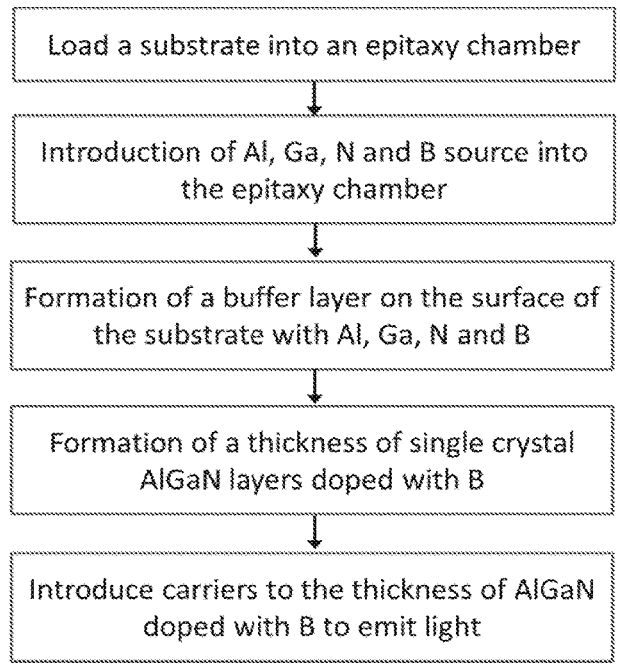
FIG. 9 is a simplified flow diagram showing an example of a process for manufacturing the device according to an example of the present invention.
Figure 10:
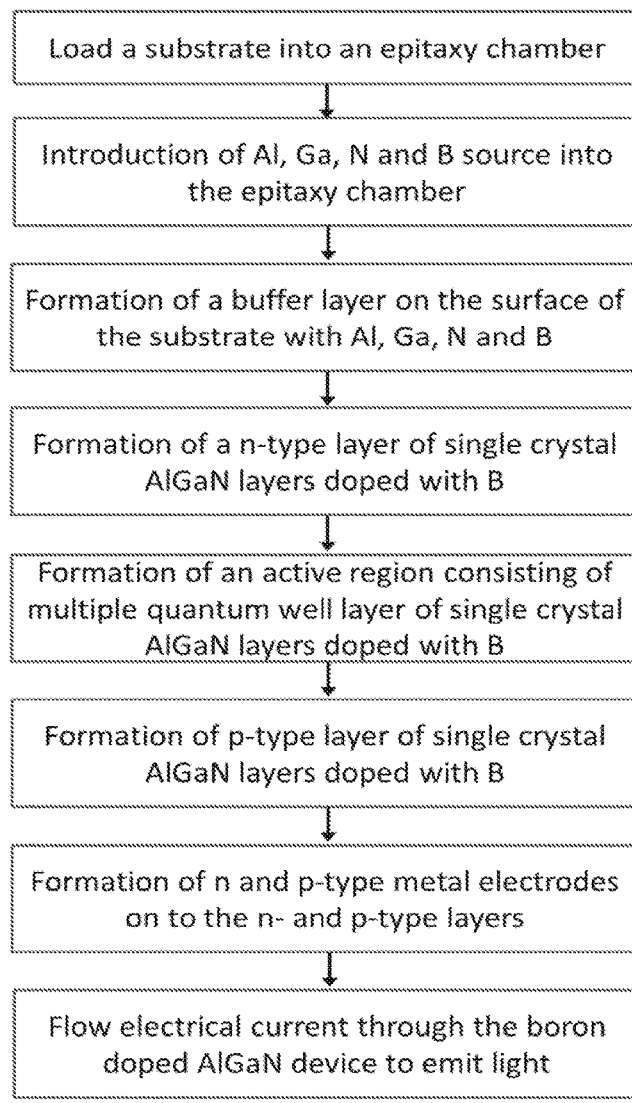
FIG. 10 is a simplified illustration of a method of fabricating a device according to an embodiment of the present invention.

FIG. 9 is a simplified flow diagram showing an example of a process for manufacturing the device according to an example of the present invention. FIG. 10 is a simplified illustration of a method of fabricating a device according to an embodiment of the present invention. These steps are merely examples, which should not unduly limit the scope of the claims herein. One of ordinary skills in the art would recognize other variations, modifications, and alternatives.

1. Start;
2. Provide a substrate member comprising a surface region;
3. Load substrate into processing chamber, such as an epitaxial reactor chamber;
4. Introduce an aluminum species from aluminum containing metalorganics or elemental aluminum;
5. Introduce a gallium species from gallium containing metalorganics or elemental gallium;
6. Introduce a nitrogen species from ammonia or pure nitrogen gas;
7. Introduce a boron species from boron containing species or compound, or a process involving a boron containing compound;
8. Mixing the aluminum, gallium, boron, and nitrogen containing species;
9. Form a thickness of material to form a buffer material overlying the substrate region;
10. Form a thickness of n-type material overlying the buffer material;
11. Initiate formation of a thickness of AlGaN material doped with boron to form an active region comprising a plurality of quantum well regions;
12. Form a barrier material overlying the active region;
13. Form a p-type material overlying the plurality of quantum well regions; and
14. Perform other steps, as desired.

In an example, the present method forms a thickness of AlGaN material formed overlying the surface region such that an aluminum concentration characterizing the AlGaN material having a range of 0 to 100% and a boron doping concentration characterizing the AlGaN material having a range between 1e15 to 1e20 atoms/centimeter3. In an example, the method causes a local strain within a portion of the AlGaN such that a first band gap energy of the thickness of boron doped AlGaN is substantially similar to a second band gap energy of AlGaN without boron doping, such that the first band gap energy is within 0.5 eV of the second band gap. Of course, there can be further variations, modifications, and alternatives.

Figure 11:
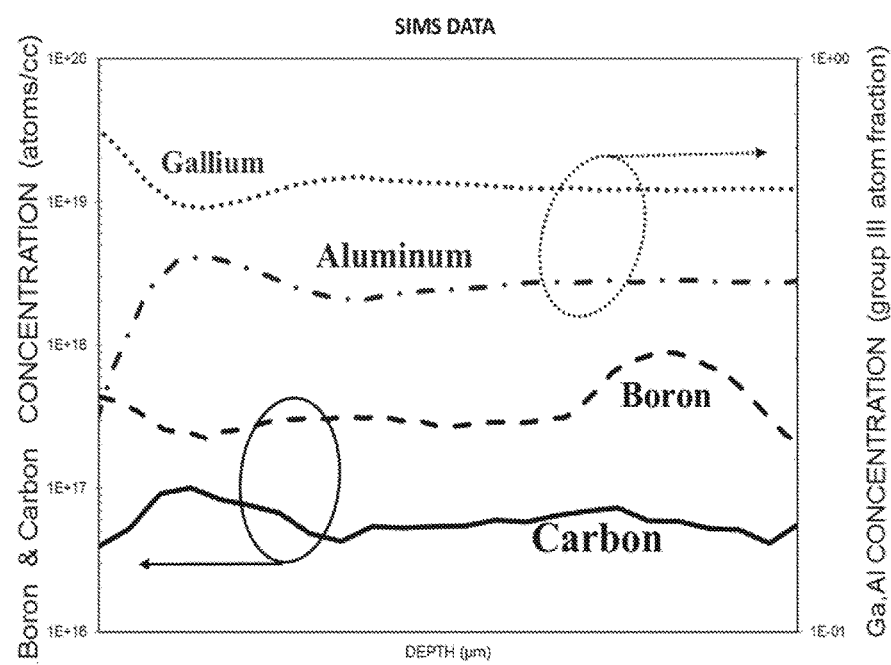
FIG. 11 is an illustration of secondary ion mass spectrometry (SIMS) Data showing boron doping concentration in AlGaN material in an example.
Figure 12:
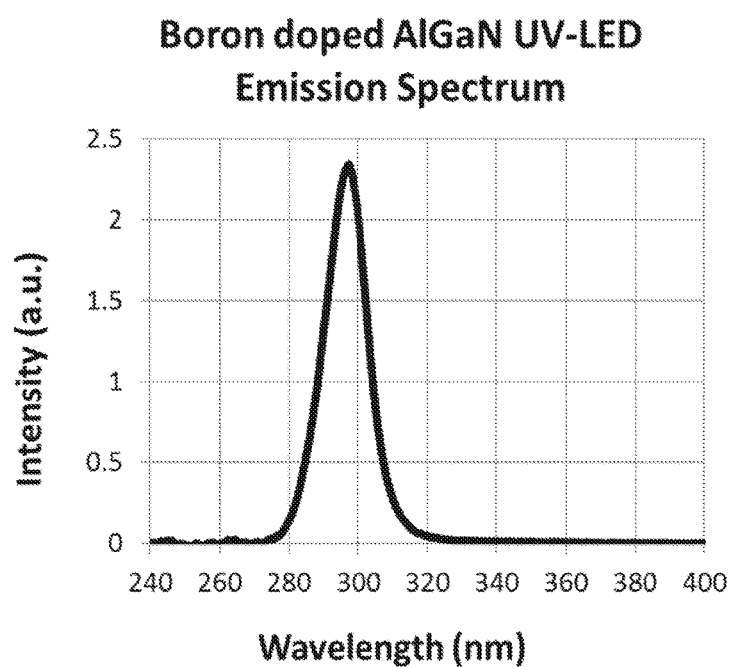
FIG. 12 is an example of a boron doped AlGaN UV LED emission spectrum following structure described in FIG. 4. The emission peaks at ~297 nm.

FIG. 11 is an illustration of SIMS Data showing boron doping concentration in AlGaN material in an example. In an example, the left axis shows concentration of boron in its atomic density as a dopant in the AlGaN material, and shown in reference to another common type of low level impurity, carbon. Of course, the level of boron doping can vary across various thickness of the film. The right axis shows the relative group III atom fraction between Ga and Al in the AlGaN material. The atomic density of Ga and Al (not shown in this figure) is in the range of 1e22 to 1e23 atoms/cc.

In an example, the aforementioned techniques have variations. In an example, the boron doping concentration is configured to localize and fix a defect density within a spatial region of the thickness of AlGaN material. In an example, the boron doping concentration is configured to cause a local strain, the strain being in a compressive mode. In an example, the boron is configured to substitute an N species within the thickness of material to cause a strain, the strain being in a compressive mode. In an example, the boron is configured to substitute either an aluminum or gallium species to cause a strain, the strain being in a tensile mode. In an example, the boron is configured to cause both a local tensile mode and a compressive mode. In an example, the boron is selectively introduced to cause either or both a tensile mode or a compressive mode. In an example, the thickness of AlGaN material is configured as an active region, the active region comprising a plurality of quantum well regions. In an example, the device further comprises a buffer region overlying the surface region. In an example, the device further has a PN junction overlying the surface region and the active region is sandwiched in between the P-layer and N-layers of the PN junction. In an example, the substrate member is selected from sapphire, GaN, silicon, silicon carbide, or other materials. In an example, the aluminum concentration ranges from 1 to 80%; wherein the boron doping concentration ranges from 1e16 to 1e18 atoms/centimeter3. In an example, the boron is configured as a dopant within the AlGaN. In an example, the light emitting efficiency is enhanced by introducing boron to a thickness of AlGaN material. In an example, the emitted light is redshifted by at least 10 nanometers by introducing boron as a dopant to the thickness of AlGaN material compared to a thickness of AlGaN material without boron, which has largely the same aluminum concentration. In an example, the emitted light is pumped by an external source providing carriers into the thickness of AlGaN layer in the form of another light source or electron source.

In an example, the present techniques has a method for fabricating a light emitting device configured to emit electromagnetic radiation in a range of 210 to 360 nanometers. The method includes providing a substrate member comprising a surface region, providing a source comprising a boron entity. The method also includes forming a thickness of AlGaN material formed overlying the surface region such that an aluminum concentration characterizing the AlGaN material having a range of 0 to 100% and a boron doping concentration characterizing the AlGaN material having a range between 1e15 to 1e20 atoms/centimeter3 to cause a local strain within a portion of the AlGaN such that a first band gap energy of the thickness of AlGaN doped with boron is substantially similar to a second band gap energy of AlGaN without boron, such that the first band gap energy is within 0.5 eV of the second band gap.

In an example, the techniques also have a light emitting device configured to emit electromagnetic radiation in a range of 210 to 360 nanometers. In an example, the device has a substrate member comprising a surface region and a thickness of AlGaN material formed overlying the surface region. The device has an aluminum concentration characterizing the AlGaN material having a range of 0 to 100% and a boron doping concentration characterizing the AlGaN material having a range between 1e15 to 1e20 atoms/centimeter3. In an example, the boron doping concentration is configured to localize and fix a defect density within a spatial region of the thickness of AlGaN material. In an example, the boron doping concentration is configured to cause a local strain, the strain being in a compressive mode or a tensile mode or both a tensile mode and a compressive mode in a first local region and a second local region, respectively, of the thickness of the AlGaN material.

In an example, the boron is configured to substitute an N species, an aluminum species, or a gallium species within the thickness of material to cause a strain, the strain being in a compressive mode; and wherein the aluminum concentration ranges from 1 to 80%; wherein the boron doping concentration ranges from 1e16 to 1e18 atoms/centimeter3.

In an example, the boron is selectively introduced to cause either or both a localized tensile mode or a localized compressive mode. In an example, the boron maintains an alloy composition of AlGaN, that is, the boron is free from forming a binary BN, alloy BAlN, BGaN, or quaternary BAlGaN or other boron alloys. In an example, alloys of boron cause undesirable influences in the device, and also leads to growth difficulties, among other issues. In an example, the boron maintains a lattice constant of the AlGaN, that is, an average lattice constant throughout a thickness of the AlGaN film. In an example, the boron maintains a thermal expansion coefficient of the AlGaN. Of course, there can be other variations, modifications, and alternatives.

REFERENCES

1. Forghani et al. J. Appl. Phys. 112, 093102 (2012)
2. J. Neugebaur Appl. Phys. Lett. 69 (22) 503
3. Z. Tang Eur. Phys. J. B (2013) 86: 284
4. J. Oila Appl. Phys. Lett. 82 (20) 3433

The present invention achieves these benefits and others in the context of known process technology. However, a further understanding of the nature and advantages of the present invention may be realized by reference to the latter portions of the specification and attached drawings.

The invention claimed is:

1. A method comprising:
   growing a semiconductor structure over a substrate, the semiconductor structure comprising:
      an n-type region;
      a p-type region;
      a light emitting layer disposed between the n-type region and the p-type region; and
      an $Al_yGa_{1-y}N$ layer, $0<y\leq1$; and
   during growth of the $Al_yGa_{1-y}N$ layer, introducing boron at a boron doping concentration between 1e15 and 1e20 atoms/centimeter$^3$,
   wherein said introducing boron comprises inducing dislocation inclination.

2. The method of claim 1 wherein introducing boron comprises growing the $Al_yGa_{1-y}N$ layer under nitrogen-rich conditions.

3. The method of claim 1 wherein introducing boron comprises incorporating boron on group V sites of the $Al_yGa_{1-y}N$ layer.

4. The method of claim 1 wherein introducing boron comprises growing the $Al_yGa_{1-y}N$ layer under nitrogen-poor conditions.

5. The method of claim 1 wherein introducing boron comprises growing the $Al_yGa_{1-y}N$ layer under stoichiometric conditions.

6. The method of claim 1 further comprising treating a surface of the substrate with a material selected from the group consisting of nitrogen-containing species, ammonia, plasma, and inert gas.

7. The method of claim 1 wherein introducing boron comprises introducing a boron containing gas species.

8. The method of claim 1 wherein introducing boron comprises using a technique selected from the group consisting of sputtering, plasma, evaporation, and implantation.

9. The method of claim 1 wherein the boron is an impurity within the $Al_yGa_{1-y}N$ layer.

10. The method of claim 1 wherein $0.01<y\leq0.8$ and the boron doping concentration is between 1e16 and 1e18 atoms/centimeter$^3$.

11. The method of claim 1 further comprising pumping the semiconductor structure by an external source comprising a light source or an electron source, the external source providing carriers into the semiconductor structure such that the light emitting layer emits light.

12. A method comprising:
   growing a semiconductor structure over a substrate, the semiconductor structure comprising:
      an n-type region;
      a p-type region;
      a light emitting layer disposed between the n-type region and the p-type region; and
      an $Al_yGa_{1-y}N$ layer, $0<y\leq1$; and
   during growth of the $Al_yGa_{1-y}N$ layer, introducing boron at a boron doping concentration between 1e15 and 1e20 atoms/centimeter$^3$,
   wherein said introducing boron comprises maintaining an average lattice constant in the $Al_yGa_{1-y}N$ layer and providing boron in a localized region of the $Al_yGa_{1-y}N$ layer.

13. A method comprising:
   growing a semiconductor structure over a substrate, the semiconductor structure comprising:
      an n-type region;
      a p-type region;
      a light emitting layer disposed between the n-type region and the p-type region; and
      an $Al_yGa_{1-y}N$ layer, $0<y\leq1$; and
   during growth of the $Al_yGa_{1-y}N$ layer, introducing boron at a boron doping concentration between 1e15 and 1e20 atoms/centimeter$^3$,
   wherein introducing boron comprises incorporating boron on group III sites of the $Al_yGa_{1-y}N$ layer.

14. A method comprising:
   growing a semiconductor structure over a substrate, the semiconductor structure comprising:
      an n-type region;
      a p-type region;
      a light emitting layer disposed between the n-type region and the p-type region; and
      an $Al_yGa_{1-y}N$ layer, $0<y\leq1$; and
   during growth of the $Al_yGa_{1-y}N$ layer, introducing boron at a boron doping concentration between 1e15 and 1e20 atoms/centimeter$^3$,
   wherein introducing boron comprises:
      growing a first portion of the $Al_yGa_{1-y}N$ layer under conditions that cause migration of point defects from the first portion; and
      growing a second portion of the $Al_yGa_{1-y}N$ layer under conditions that trap point defects in the second portion.

15. The method of claim 14 further comprising supplying current to the semiconductor structure, wherein the first portion carries more current than the second portion.

16. A method comprising:
growing a semiconductor structure over a substrate, the semiconductor structure comprising:
  an n-type region;
  a p-type region;
  a light emitting layer disposed between the n-type region and the p-type region; and
  an $Al_yGa_{1-y}N$ layer, $0<y\leq1$; and
during growth of the $Al_yGa_{1-y}N$ layer, introducing boron at a boron doping concentration between 1e15 and 1e20 atoms/centimeter³,
wherein the $Al_yGa_{1-y}N$ layer comprises a first portion with a boron concentration between 1e15 and 1e22 atoms/centimeter³ and a second portion with no boron, wherein:
the first portion has a first band gap energy;
the second portion has a second band gap energy; and
the first band gap energy is within 0.5 eV of the second band gap energy.

* * * * *